United States Patent [19]

Han

[11] Patent Number: 5,414,519
[45] Date of Patent: May 9, 1995

[54] METHOD FOR ALIGNING A SEMICONDUCTOR CHIP TO BE REPAIRED WITH A REPAIR SYSTEM AND A LASER REPAIR TARGET USED THEREFOR

[75] Inventor: Byoung Y. Han, Seoul, Rep. of Korea

[73] Assignee: Goldstar Electron Co., Ltd., Choongchungbook, Rep. of Korea

[21] Appl. No.: 858,723

[22] Filed: Mar. 27, 1992

[30] Foreign Application Priority Data

Apr. 12, 1991 [KR] Rep. of Korea ............... 5891/1991

[51] Int. Cl.6 ............................................. C01B 11/00
[52] U.S. Cl. ..................................................... 356/401
[58] Field of Search .............................. 356/399–401, 356/375, 150, 152; 101/DIG. 36; 437/924

[56] References Cited

U.S. PATENT DOCUMENTS

| | | | |
|---|---|---|---|
| 4,385,838 | 5/1983 | Nakazawa et al. | 356/401 |
| 4,575,250 | 3/1986 | Suzuki | 356/401 |
| 4,856,903 | 8/1989 | Kipphan et al. | 356/400 |

FOREIGN PATENT DOCUMENTS

| | | | |
|---|---|---|---|
| 2676129 | 11/1992 | France | 356/400 |
| 0200905 | 11/1984 | Japan | 356/375 |
| 0258420 | 11/1986 | Japan | 437/924 |
| 0296339 | 12/1988 | Japan | 437/924 |

*Primary Examiner*—Richard A. Rosenberger
*Assistant Examiner*—K. P. Hantis
*Attorney, Agent, or Firm*—Lowe, Price, LeBlanc & Becker

[57] ABSTRACT

A method for aligning a semiconductor chip to be repaired with a repair system and a laser repair target used therefor, The laser repair target comprises at least one basic target adapted to be used in focusing, X-alignment and Y-alignment and shaped into a right-angled triangle and at least one bar type target adapted to be used in Theta-alignment. The laser repair target has selected targets at corners thereof, respectively. Offsets in X-direction and Y-direction are calculated on the basis of respective differences in X-coordinate and Y-coordinate between center X- and Y-coordinates and X- and Y-coordinates in actual scanning. It is possible to reduce the time required for the alignment of semiconductor chip to be repaired, thereby improving the productivity of semiconductor chips and reducing the total area of each semiconductor chip.

7 Claims, 5 Drawing Sheets

(UNIT: μm)

METHOD FOR ALIGNING A SEMICONDUCTOR CHIP TO BE REPAIRED WITH A REPAIR SYSTEM AND A LASER REPAIR TARGET USED THEREFOR

BACKGROUND OF THE INVENTION

1. Filed of the Invention

The present invention relates to a method for aligning a semiconductor chip to be repaired with a repair system and a laser repair target used therefor.

2. Description of the Prior Art

A repair system is generally utilized in repairing a cell failure of semiconductor chips. Upon repairing, a wafer, that is, a semiconductor chip is first laid on the repair system and then exposed to a laser so that an alignment of the semiconductor chip with the repair system can be checked.

Such alignment involves a focusing for adjusting the height of the semiconductor chip above the repair system to correspond it to a required height, an X-alignment for compensating an offset for the movement of laser in X-direction, a Y-alignment for compensating an offset for the movement of laser in Y-direction, and a Theta-alignment for compensating an offset from a rotational center of the repair system and the semiconductor chip. These focusings, X-alignment, Y-alignment and Theta alignment are carried out for each semiconductor chip. At this time, laser repair targets are utilized which are formed at respective corners of each semiconductor chip to have a proper shape.

Under the condition that precise alignment between the repair system and the semiconductor chip has been accomplished, laser is scanned to the semiconductor chip to determine whether a cell failure has occurred in the semiconductor chip. Even in case a cell of one bit has failed, the line including the failed cell is treated as being poor. That is, a redundancy circuit is changed to substitute the failed line by a spare cell.

As such a laser repair method, an address suppression method has been recently used, in place of a typical decoding method. In case of using the address suppression method, it is possible to perform a laser repair precess after a passivation process. In this case, a pad mask is provided for etching the area around each target upon a pad etching for an alignment of the target.

Now, the above-mentioned typical alignment of semiconductor chip will be described, in conjunction with FIG. 1.

FIG. 1 is an enlarged plan view of a semiconductor chip 1 laid on a repair system (not shown) for a laser repair. As shown in FIG. 1, the semiconductor chip 1 has at each corner thereof a laser repair target 2 having a shape of substantially "L".

In FIG. 1, the arrow "a" designates the direction of carrying out a focusing, the arrow "b" the direction of carrying out an X-alignment, the arrow "c" the direction of carrying out a Y-alignment, and the arrow "d" the direction of carrying out a Theta-alignment which follows the Y-alignment.

In carrying out the alignment, laser is scanned to a left upper end target 2 in X-direction to measure an offset for the movement of laser in X-direction. By compensating the offset, an X-alignment is accomplished. Thereafter, laser is scanned to a left upper end target 2 in Y-direction to measure an offset for the movement of laser in Y-direction. By compensating the offset, a Y-alignment is accomplished.

Subsequently, laser is scanned to a right upper end target 2 in Y-direction to measure an offset for the movement of laser in Y-direction.

Assuming that $Y_{offy}$ [μm] is the offset in Y-alignment in the arrow "c", $Y_{offt}$[μm] the offset in alignment in the arrow "d", $X_{gap}$[μ] the difference (absolute value) between respective X-coordinates in arrows c and d, the value of Theta is expressed by the following equation:

$$\text{Theta} = (Y_{offy} + Y_{offt})/X_{gap} \text{ [micro radian]}$$

The value of Theta corresponds substantially to sin $\ominus$ (the unit of $\ominus$ is radian), since the distance between opposite targets 2 is very longer than $Y_{offt}$. Accordingly, the Theta alignment can be accomplished by rotating the system at a proper angle to compensate an offset.

On the other hand, FIG. 2 shows the area of a region 3 etched in a pad etching process, where respective lengths of the target 2 in X-direction and Y-direction are 50 μm. When respective lengths of each target 2 in X-direction and Y-direction are 50 μm, the area of etch region 3 is generally 100 μm × 100 μm. The area is a proper area for accomplishing accurately the alignment of targets 2, which area corresponds to four times the area of each target 2.

Since each target 2 has a shape of "L", in the prior art, however, the alignment can be accomplished by performing four operations, that is, focusing, X-alignment, Y-alignment and Theta alignment, for every semiconductor chip. As a result, the alignment requires a lot of time, thereby causing the productivity to be considerably decreased. Furthermore, each etch region 3 occupies a substantial portion of the area of semiconductor chip, since it corresponds to about four times the area of each target 2.

SUMMARY OF THE INVENTION

Therefore, an object of the invention is to provide a method for aligning a semiconductor chip to be repaired with a laser repair system and a laser repair target used therefor, which are capable of reducing the time required for the alignment of the semiconductor chip to be repaired and reducing the etch area required for the alignment of the laser repair target, thereby improving the productivity of semiconductor chips and reducing the total area of each semiconductor chip.

In one aspect, the present invention provides a method for aligning a semiconductor chip to be repaired with a repair system comprising the steps of: scanning a basic target to calculate offsets in X-direction and Y-direction; and performing X-alignment and Y-alignment simultaneously.

In another aspect, the present invention provides a laser repair target used in laser repairing a semioconductor chip, comprising: at least one basic target adapted to be used in focusing, X-alignment and Y-alignment and disposed at a selected corner of the semiconductor chip; and at least one bar type target adapted to be used in Theta-alignment and disposed at a selected corner of the semiconductor chip.

BRIEF DESCRIPTION OF THE DRAWINGS

Other objects and aspects of the invention will become apparent from the following description of embodiments with reference to the accompanying drawings in which:

FIGS. 3A to 3D and 4A to 4D are plan views illustrating various practical uses of laser repair targets according to the present invention, wherein FIGS. 3A to 3D show X-scan basic targets, while FIGS. 4A to 4D show Y-scan basic targets;

FIGS. 5A and 5B are plan views illustrating another practical uses of laser repair target according to the present invention, wherein FIG. A shows a bar type target for calculating an offset In X-alignment, while FIG. 5B shows a bar type target for calculating an offset in Y-alignment;

DESCRIPTION OF THE PREFERRED EMBODIMENTS

Referring to FIGS. 3A to 3D, there are shown basic targets 10 and each of which has a triangular shape with a gradient predetermined for carrying out simultaneously X-alignment and Y-alignment, in accordance with the present invention. It is preferred that basic targets 10 and 20 have a shape of right-angled triangle. More preferably, they have a shape of right-angled isosceles triangle.

Figure 1:
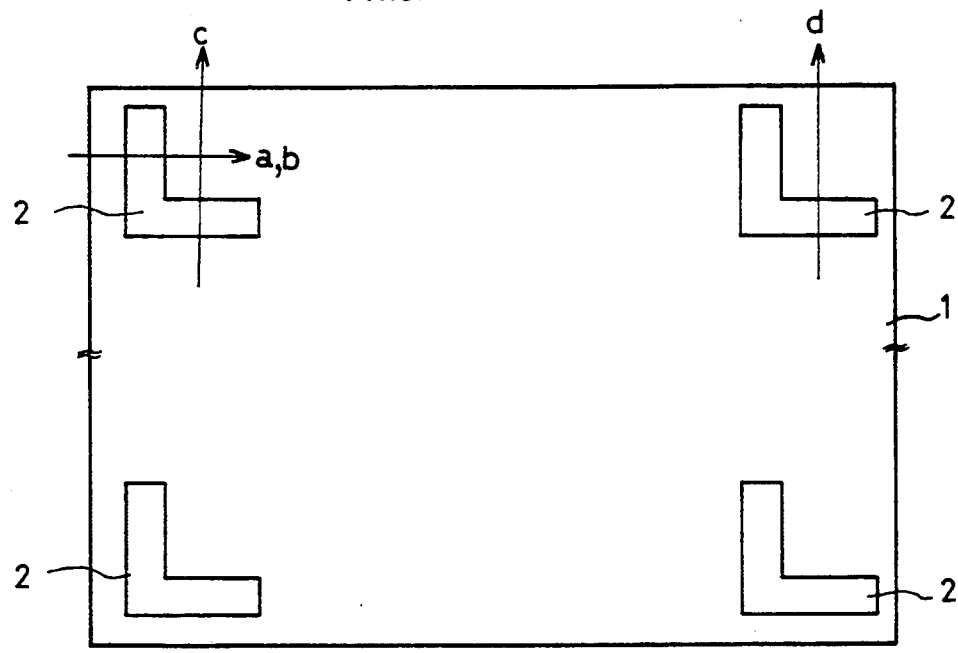
FIG. 1 is an enlarged plan view for explaining a conventional method for aligning a semiconductor chip to be repaired with a repair system.
Figure 2:
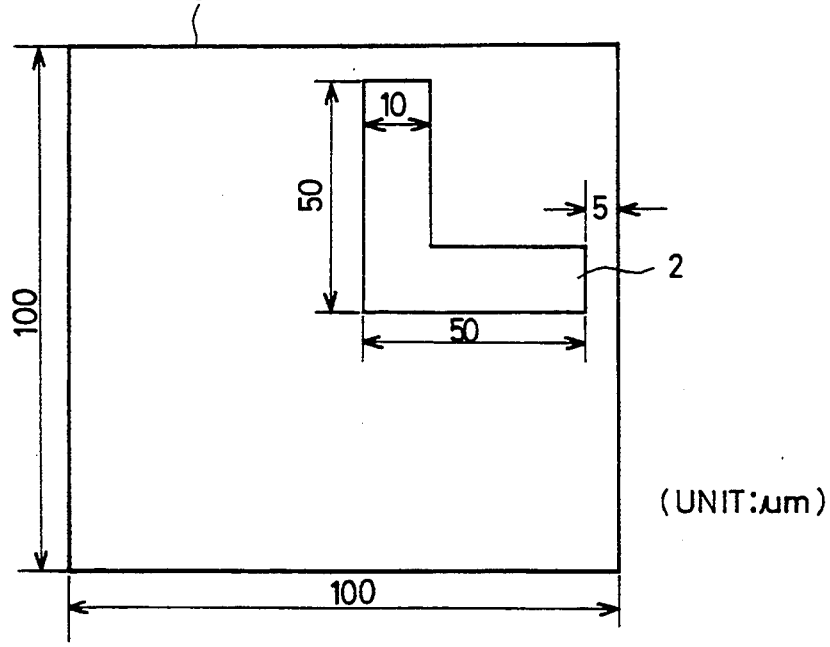
FIG. 2 is a partially enlarged view for explaining etch regions of the semiconductor chip shown in FIG. 1.
Figure 3A:
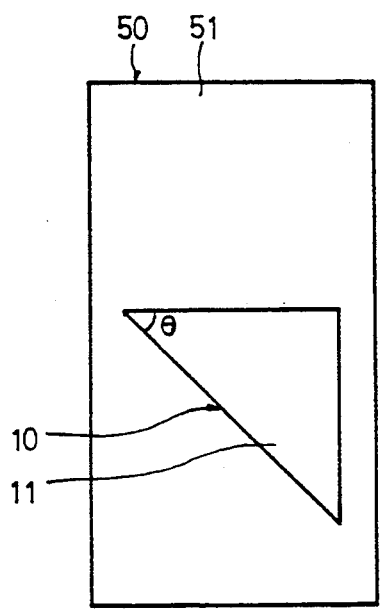
Figure 3B:
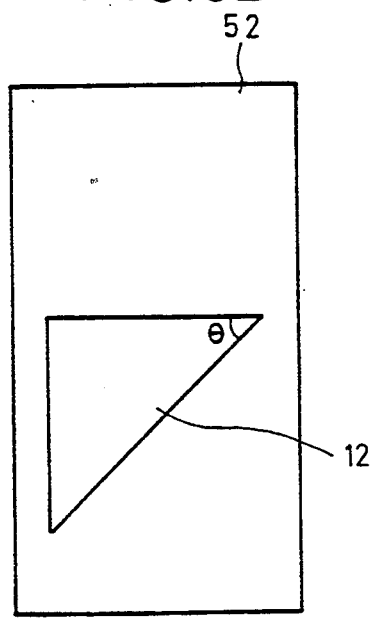
Figure 3C:
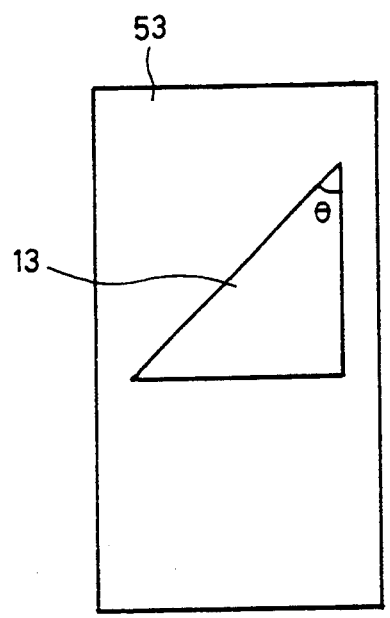
Figure 3D:
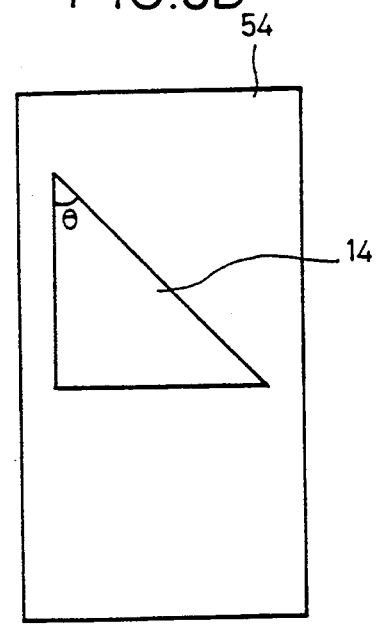

That is, the X-scan basic target 10 comprises four basic target portions 11 to 14 shaped into right-angled equilateral triangles having different orientations, respectively, as shown in FIGS. 3A and 3D, The X-scan basic target 10 also comprises four etch regions 51 to 54 (totally, 50) each including a first region portion having a width (for example, 40 $\mu$m) identical to the base length (for example, 40 $\mu$m) of the basic target 10, a second region portion having a width (for example, 20 $\mu$m) corresponding to a half of the base length of the basic target 10, and third and fourth region portions each having a width (for example, 5 $\mu$m) corresponding to ⅛ of the base length of the basic target 10. The first region portion and the second region portion are disposed at left and right sides of the basic target or right, respectively, or vice versa. The third region portion and the fourth portion are disposed at upper and lower sides of the bisic target, respectively, or vice versa.

Figure 4A:
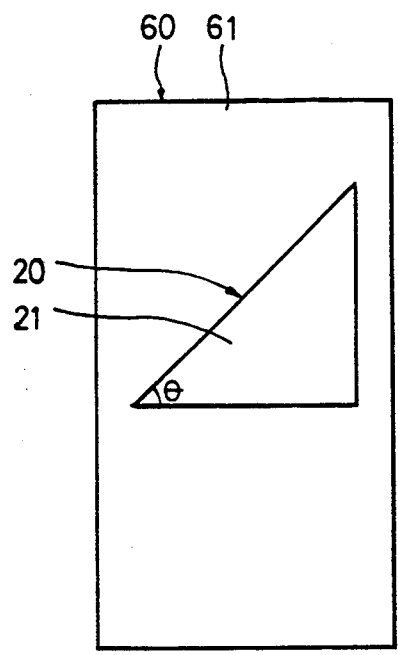
Figure 4B:
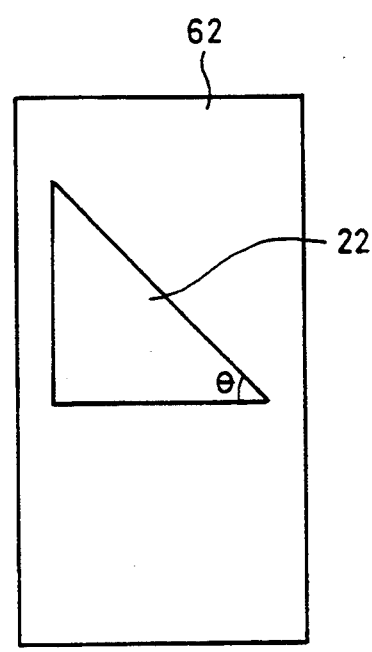
Figure 4C:
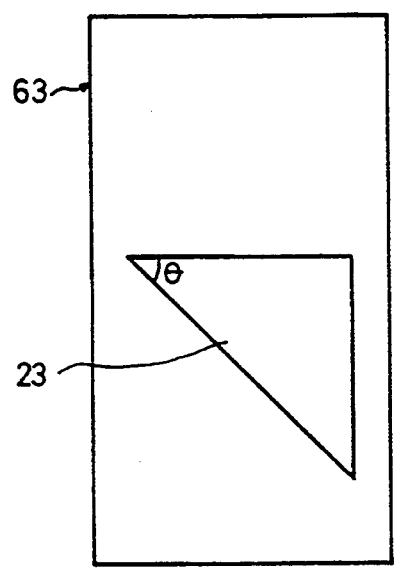
Figure 4D:
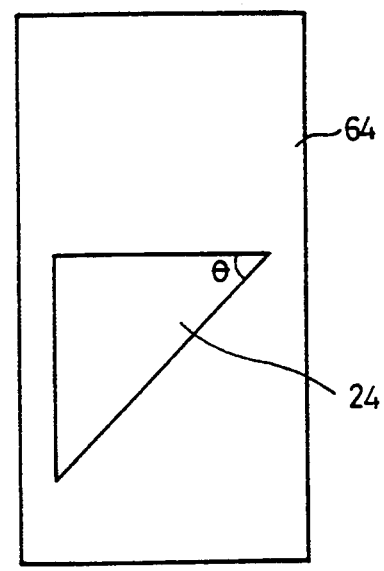

On the other hand, the Y-scan basic target 20 of FIG. 4A which performs an alignment according to a scanning in a longitudinal direction comprises four basic target portions 21 to 24 shaped into right-angled isosceles triangles having different orientations, respectively, as shown in FIGS. 4A and 4D. The Y-scan basic target 20 also comprises four etch regions 61 to 64 (totally, 60) each including a first region portion having a width (for example, 40 $\mu$m) identical to the base length (for example, 40 $\mu$m) of the basic target 20, a second region portion having a width (for example, 20 $\mu$m) corresponding to a half of the base length of the basic target 20, and third and fourth region portions each having a width (for example, 5 $\mu$m) corresponding to ⅛ of the base length of the basic target 20. The first region portion and the second region portion are arranged on upper and lower sides of the basic target or right, respectively, or vice versa. The third region portion and the fourth portion are arranged on left and right sides of the basic target, respectively, or vice versa.

Figure 5A:
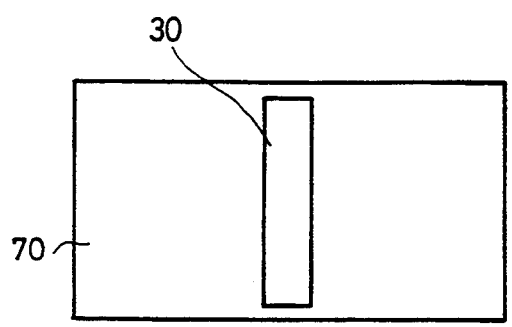

For Theta-alignment, there are provided bar type targets 30 and 40, in accordance with the present invention. As shown in FIG. 5A, the bar type target 30 for X-alignment is shaped into a longitudinal, that is, vertical bar having a predetermined height (for example, 40 $\mu$m) and a predetermined width (for example, 10 $\mu$m). Around the bar type target 30, an etch region 70 is formed, which comprises a pair of first region portions having a predetermined width (for example, 45 $\mu$m) and disposed at left and right sides of the bar type target 30, respectively, and a pair of second region portions having a predetermined width (for example, 5 $\mu$m) and disposed at upper and lower sides of the bar type target 30, respectively.

Figure 5B:
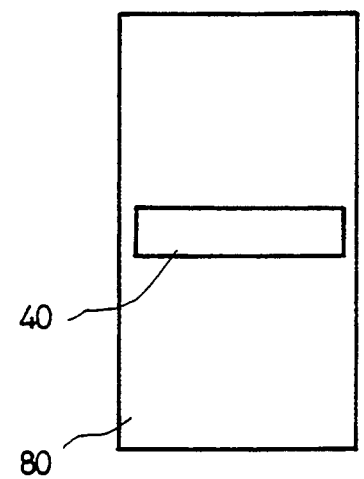

As shown in FIG. 5B, the bar type target 40 for Y-alignment is shaped into a transverse bar having a predetermined height (for example, 10 $\mu$m) and a predetermined width (for example, 40 $\mu$m). Around the bar type target 40, an etch region 80 is formed, which comprises a pair of first region portions having a predetermined width (for example, 5 $\mu$m) and disposed at left and right sides of the bar type target 40, respectively, and a pair of second region portions having a predetermined width (for example, 45 $\mu$m) and disposed at upper and lower sides of the bar type target 40, respectively.

Respective dimensions of basic targets 11, 12, 13, 14, 21, 22, 23 and 24, bar type targets 30 and 40, and etch regions 50 (51, 52, 53 and 54), 60 (61, 62, 63 and 64), 70 and 80 are practical values generally used in a laser repair. If desired, these dimensions may be varied.

Figure 6:
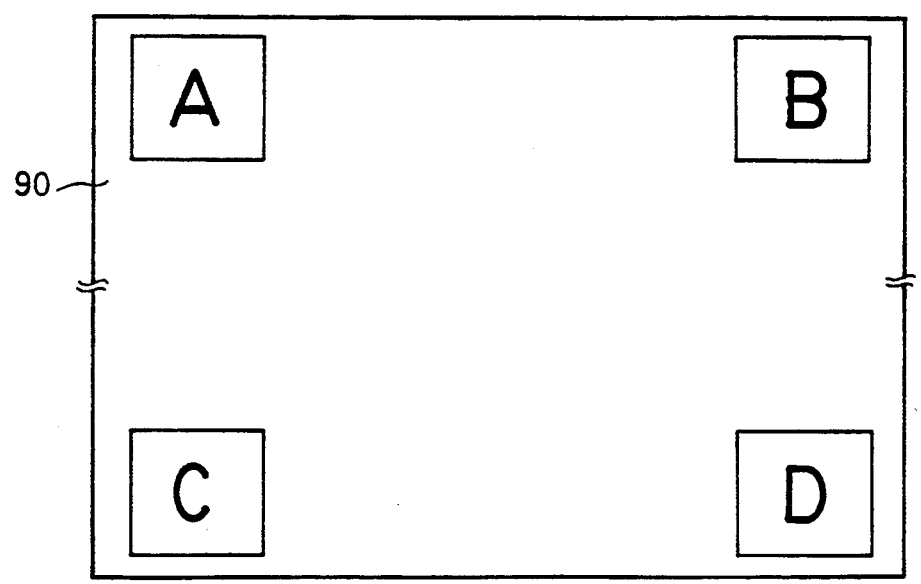
FIG. 6 is a plan view of a semiconductor chip according to the present invention.

Referring to FIG. 6, there is shown a semiconductor chip 90 having laser repair targets according to the present invention. As shown in FIG. 6, the semiconductor chip 60 has a construction wherein basic targets 10 and 20 and bar type targets 30 and 40 shown in FIGS. 3 to 5 are selectively formed at four corners A to D. The semiconductor chip 90 should have at least one of basic targets 10 and 20 and at least one of bar type targets 30 and 40.

In case of having one X-scan basic target 10 (that is, one of its target portions 11 to 14) at its one corner, the semiconductor chip 90 is preferred to have at another corner thereof the vertical bar type target 30 shown in FIG. 5A. On the other hand, where the semiconductor chip 90 has one Y-scan basic target 20 (that is, one of its target portions 21 to 24) at its one corner, it has preferably at another corner thereof the vertical bar type target 40 shown in FIG. 5B. In either case, the semiconductor chip 90 may have at remaining two corners thereof any types of targets selected from targets 10, 20, 30 and 40.

Figure 7A:
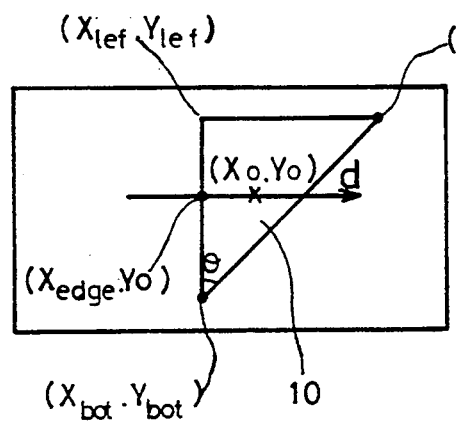
FIGS. 7A and 7B are is a plan view for explaining a method for aligning a semiconductor chip to be repaired with a repair system, in accordance with an embodiment of the present invention.
Figure 7B:
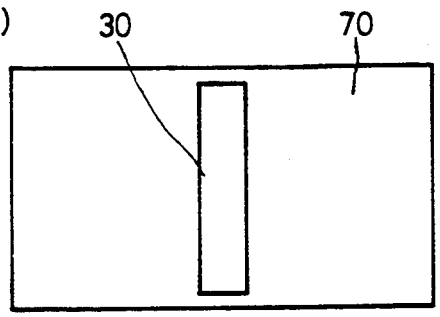

Now, an alignment according to an embodiment of the present invention will be described, in conjunction with a case where the X-scan basic target 10 shown in FIG. 3A and the bar type target 30 shown in FIG. 5A are selected as shown in FIGS. 7A and 7B.

In the case, if Y-coordinate Yo and X-coordinate Xo in X-scanning, which correspond to the center of the basic target 10 are $(Y_{lef}+Y_{bot})/2$ and $X_{lef}+(X_{rig}+X$-

$_{lef})/4$, respectively, the width of the basic target 10 is $2\times(X_{rig}-X_{lef})/4$.

An offset $X_{offset}$ in X-direction occurring as X-scanning is carried out in a direction indicated by the arrow d under the above condition corresponds to the difference between $X_{lef}(=X_{bot})$ and a target edge $X_{edge}$ in practical scanning. The offset $X_{offset}$ can be expressed by $|X_{lef}-X_{edge}|$.

On the other hand, an offset $Y_{offset}$ in Y-direction corresponds to the difference between the target width and the width in practical scanning. Accordingly, it is possible to carry out simultaneously X-alignment and Y-alignment.

After the completion of X-alignment and Y-alignment, Theta-alignment is carried out by the basic target 10 and the bar type target 30. This Theta-alignment is performed in a conventional manner.

That is, the Theta-alignment is carried out by calculating the value of Theta by using the X-direction offset $X_{offt}$ obtained from the X-alignment of the bar-type target 30, the X-direction offset $X_{offy}$ obtained from the X-alignment of the basic target 10 and the difference $Y_{gap}$ (absolute value) between the basic target 10 and the bar type target 30, as follows:

$$\text{Theta}=(X_{offt}+X_{offy})/Y_{gap}[\text{micro radian}]$$

On the other hand, an alignment with respect to an optional angle $\ominus$ of the basic target 10 will now be described, in conjunction with FIG. 8.

Figure 8:
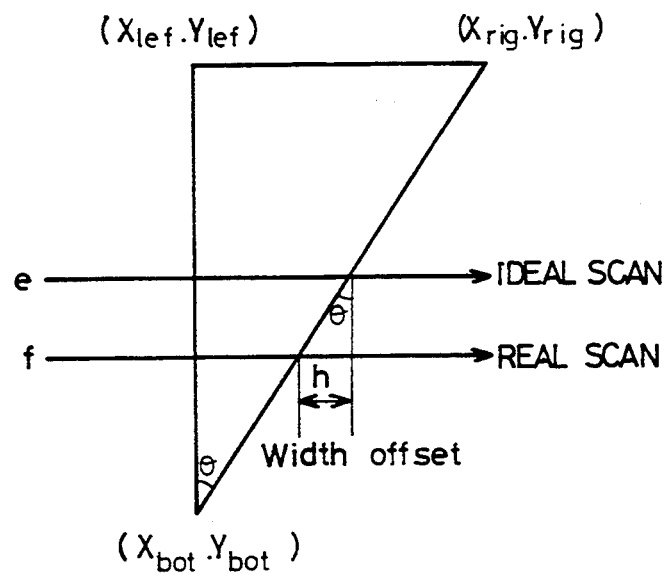
FIG. 8 is a plan view for explaining a method for aligning a semiconductor chip to be repaired with a repair system, in accordance with another embodiment of the present invention.

As shown in FIG. 8, the method for calculating the X-direction offset $X_{offset}$ when the angle $\ominus$ is an optional angle other than 45° is the same as in the above-mentioned embodiment of the present invention. On the other hand, the Y-direction offset $Y_{offset}$ can be calculated as follows.

That is, assuming that the direction indicated by the arrow "e" in FIG. 8 is an ideal X-scanning direction and the direction indicated by the arrow "f" in FIG. 8 is an actual X-scanning direction, the following equation is established:

$$\tan\ominus=(X_{rig}-X_{lef})/(Y_{lef}-Y_{bot})=\text{width}$$
$$(\text{h})_{offset}/Y_{offset}$$

Accordingly, the offset $Y_{offset}$ can be calculated by the equation, in that $Y_{offset}$ is width(h)$_{offset}$/tan $\ominus$. Thus, Y-alignment can be carried out.

As above-mentioned, simultaneous X-alignment and Y-alignment can be accomplished only by using X-scanning or Y-scanning which is carried out by using triangular targets and bar targets, in accordance with the present invention. For X-alignment and Y-alignment, the prior art requires both X-scanning and Y-scanning, thereby requiring X-scan and Y-scan etch regions around targets upon X-scanning and Y-scanning. Basically, the prior art requires at least four etch regions disposed left, right, upper and lower slides of each target. However, the present invention requires only 50% of the etch region area required in the prior art, in case of using basic targets, since simultaneous X-alignment and Y-alignment can be accomplished only by using X-scanning or Y-scanning. In case of using bar type targets for Theta-alignment, the etch region area can be reduced to 55%.

As apparent from the above description, the present invention provides a method for carrying out an alignment of a semiconductor chip, by using basic targets shaped into a right-angled triangle and bar type targets, thereby enabling simultaneous X-alignment and Y-alignment. Accordingly, it is possible to reduce the time required for the alignment of semicondcutor chip to be repaired, thereby improving the productivity of semiconductor chips and reducing the total area of each semiconductor chip. Since the etch region area can be reduced to 50% in case of basic targets and 55% in case of bar type targets, it is possible to provide more compact semiconductor chips.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for aligning a semiconductor chip to be repaired with a repair system comprising the steps of:
   scanning a basic target on said semiconductor chip with a laser in either an X-direction or a Y-direction to calculate offsets in both X-direction and Y-direction; and
   determining an X-coordinate and Y-coordinate simultaneously from the scan of said basic target, wherein offsets in X-direction and Y-direction are calculated on the basis of respective differences in X-coordinate and Y-coordinate between center X- and Y-coordinates and X- and Y-coordinates in actual scanning.

2. A method in accordance with claim 1, wherein the step of scanning the basic target comprises an X-scanning for scanning transversely the basic target.

3. A method in accordance with claim 1, wherein the step of scanning the basic target comprises an Y-scanning for scanning longitudinally the basic target.

4. A laser repair target used in laser repairing a semiconductor chip, comprising:
   at least one basic target for focusing and simultaneously determining an X-coordinate and Y-coordinate and disposed at a selected corner of the semiconductor chip; and
   at least one bar type target for determining Theta-position and disposed at a selected corner of the semiconductor chip, wherein the at least one basic target is shaped into a right-angled isosceles triangle.

5. A laser repair target in accordance with claim 4, wherein the at least one basic target comprises an X-scan basic target for scanning transversely the semiconductor chip or a Y-scan basic target for scanning longitudinally the semiconductor chip.

6. A laser repair target in accordance with claim 4, wherein the at least one bar type target comprises an X-scan bar type target for scanning transversely the semicondcutor chip or a Y-scan bar type target for scanning longitudinally the semiconductor chip.

7. A laser repair target in accordance with claim 4, wherein the laser repair target comprises at least one selected from X- and Y-scan basic targets and at least one selected from X- and Y-scan bar type targets.

* * * * *